SR CROSS REFERENCE SEARCH RO
XR 3,234,488 9008
X 89213

Feb. 8, 1966 I. E. FAIR 3,234,488

LIGHT MODULABLE CIRCUIT ELEMENT

Filed Sept. 12, 1960 2 Sheets-Sheet 1

INVENTOR
I. E. FAIR
BY George S. Indig
ATTORNEY

3234488
OR IN 357/30

Feb. 8, 1966 I. E. FAIR 3,234,488

LIGHT MODULABLE CIRCUIT ELEMENT

Filed Sept. 12, 1960 2 Sheets-Sheet 2

INVENTOR
I. E. FAIR
BY George S. Indig
ATTORNEY 3,234,488

LIGHT MODULABLE CIRCUIT ELEMENT

Irvin E. Fair, Bedminster, N.J., assignor to Bell Telephone Laboratories, Incorporated, New York, N.Y., a corporation of New York Filed Sept. 12, 1960, Ser. No. 55,464
3 Claims. (Cl. 333—30)

This invention relates to a novel method and means for modulating the conductivity of a piezoelectric material. More specifically, it concerns a simple, yet effective, procedure for modulating the piezoelectric effect in various photosensitive materials through the use of light. While various uses for such control mechanism will become apparent, the following description is specifically directed to variable ultrasonic delay lines for which this invention is particularly well adapted.

This invention is essentially an improvement of the electromechanical circuit element disclosed and claimed in copending application Serial No. 23,441 filed April 20, 1960, entitled "Circuit Element." That application concerns a novel piezoelectric circuit element as a light modulable acoustical or ultrasonic transmitter. The effect of illuminating the surface of certain photosensitive piezoelectric materials is to vary the conductivity of the material as compared with the "dark" conductivity. This variation is responsive to a particular range of light intensities and shows definite maximum and minimum values corresponding to "dark" and "light" conditions. The acoustical effect of varying the conductivity of such a material is a variation in the acoustic velocity in the material. The variation in acoustic velocity may be considered in terms of equivalent "stiffness" of the material. Stiffness in turn may be considered as a measure of the energy required to physically deform a body by a given amount. It follows that superimposing a piezoelectric effect on a given physical material, due to the amount of energy required to create the piezoelectric field, results in increasing the "stiffness." It further follows that this increase in "stiffness" results in an increase in the velocity of sound and, therefore, a decrease in the acoustic delay. Increasing the electrical conductivity results in shorting out at least a portion of the piezoelectric field and so reduces the "stiffness," ultimately, to the non-piezoelectric value for the material thus resulting in a decrease in acoustic velocity.

In the preferred form of this invention, a piezoelectric material which also shows the appropriate attendant photoelectric sensitivity is used as the active element in a variable ultrasonic delay line. The desired variation is achieved by altering the area of the surface of the active element exposed to light. In view of the foregoing, the obvious effect of this is to vary the conductivity of a portion of the element, thus providing a variable control on the overall acoustic velocity through the material. The delay time for sound being transmitted through the delay medium is thus modulated by the extent of the medium exposed to light. To fully appreciate the advantages of this particular modulating technique, the piezoelectric relaxation mechanism must be considered.

The variation in delay provided by an element by virtue of its change in piezoelectric quality is considered to be a relaxation phenomenon. Consistent with this view, it has been observed that the acoustic velocity variation is accompanied by an attenuation peak. The maximum point of this peak is approximately coincidental with the most extreme variation in velocity. The presence of this attenuation peak accounts for the successful operation of various devices designed to modulate or filter acoustic signals. Such devices are fully treated in the application previously referred to. However, when concerned, for instance, with ultrasonic delay lines to which this invention is specifically directed, if use is to be made of the variation in acoustic velocity, the signal will necessarily suffer an attenuation. This follows since the attenuation peak accompanies essentially the entire range of velocity variation. It is practical by this procedure to modulate from one light condition to the other light condition, i.e., from light to dark; however, this provides for only one variation. If it is attempted to operate at any value intermediate the extremes, attenuation occurs. Consequently, the light modulating technique of varying the intensity of the light to vary the acoustic velocity is not altogether suitable.

The present invention eliminates interference from the attenuation peak and allows for acoustic velocity variation without attendant losses. This is done as set forth previously by operating each portion of the element either at the light condition or the dark condition by illuminating portions thereof. Since the acoustic velocity is slower in the illuminated portion, the amount of delay will be directly determined by the relative extent of illuminated and dark portions of the element. It is seen that no substantial part of the element is operating in the intermediate area between the light and dark conditions where the maximum velocity variation occurs. The entire element is operating either at maximum or minimum velocity. Accordingly, the attenuation associated with the range of velocity variations is avoided.

The foregoing is perhaps more easily understood when considered with the aid of the drawings in which.

Figure 1:
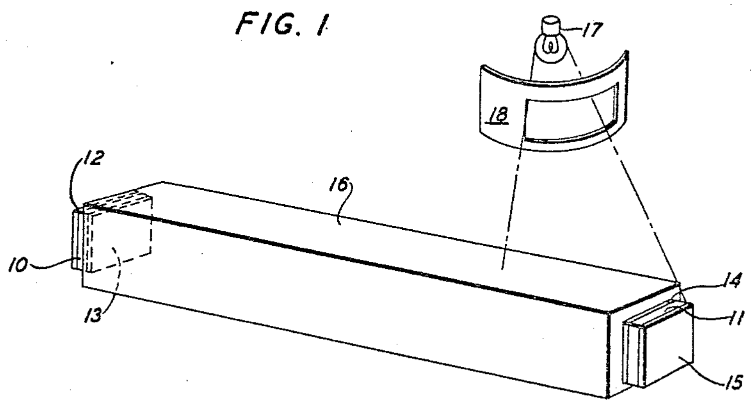
FIG. 1 is a perspective view of an ultrasonic delay line utilizing a piezoelectric delay material which manifests a light-modulable conductivity mechanism.

FIG. 1 shows a typical ultrasonic delay line device. It consists of piezoelectric elements 10 and 11, element 10 being provided with deposited electrodes 12 and 13 and element 11 being similarly provided with electrodes 14 and 15. Piezoelectric transducers 10 and 11 are cemented or otherwise affixed to delay element 16, which is composed of a conductivity-modulable piezoelectric material. A field across transducer 10 initiates vibrations which are transmitted through the delay element 16 to transducer 11 where the vibrations produce a field across electrodes 14 and 15 and an electrical signal obtained. The degree of delay afforded by delay element 16 is light modulated according to the principles of this invention by the use of light source 17. A shutter or other appropriate means 18 is used to vary the portion of the element 16 which is exposed to the light. Thereby all portions of element 16 are either dark or light. Since the delay is longest with the entire element in the dark condition, the degree of delay provided by element 16 is represented as follows:

$$D = D_{\text{dark}} + (D_{\text{light}} - D_{\text{dark}})\frac{E_1}{E_2}$$

where D is the delay time of the overall element, $D_{\text{dark}}$ is the delay time for the element in the dark condition, $D_{light}$ is the delay time for the element in the light condition, $E_1$ is the length of the element illuminated, and $E_2$ is the total length of the element.

Figure 2:
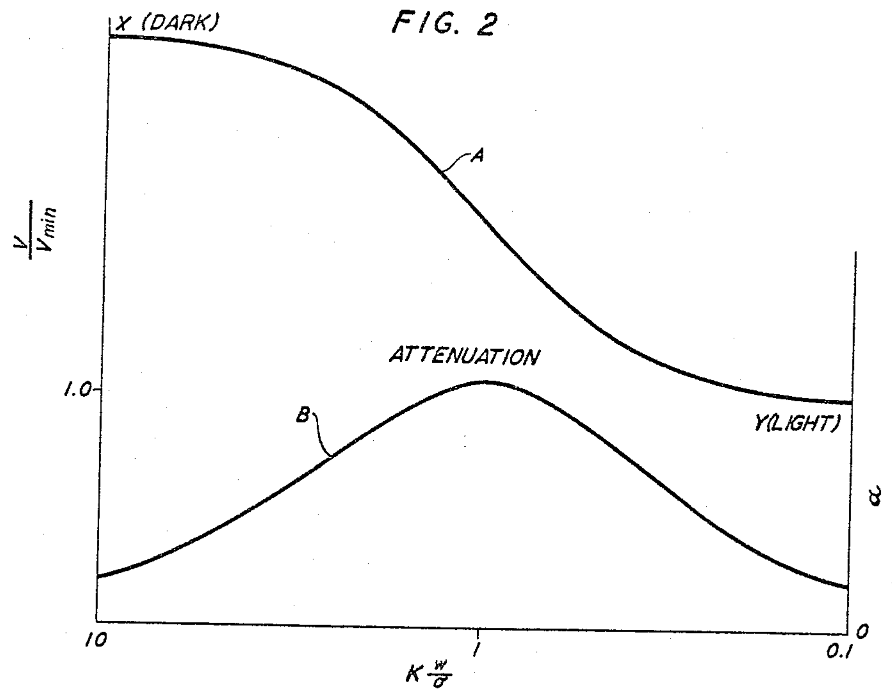
FIG. 2 is a plot containing a first curve showing velocity variation and a second curve showing attenuation both plotted as ordinates and compared with electrical conductivity along the abscissa.

In FIG. 2, curve A shows the velocity variation with conductivity or frequency. It is obvious that the propagation of sound through a medium varies with either parameter independently. The velocity varies directly with frequency and inversely with conductivity. Hence, for a given material, the abscissa units in FIG. 2 are appropriately $$K\frac{\omega}{\sigma}$$

where K is a constant characteristic of the material, $\omega$ is the frequency and $\sigma$ is the conductivity. The resulting units are c.g.s electrostatic units. The ordinate units for curve A are $\nu/\nu_{min}$, where $\nu$ is the velocity in cm./sec. and $\nu_{min}$ is the minimum velocity which can be attained by varying the conductivity or the frequency in the same units.

Curve B in FIG. 2 shows the attenuation peak associated with the velocity variation. The abscissa units of curve B are the same as those for curve A. Curve B is plotted against $\alpha$ on the ordinate, which is the absorption constant in cm.$^{-1}$ such that the acoustic intensity in a wave travelling in the $+x$ direction decreases in intensity according to the law: $I=I_0 \exp. (-\alpha x)$ where $I$=acoustic intensity and $I_0$=acoustic intensity at $x=0$. Therefore, $\alpha$ is a constant for a given material which reflects the acoustical losses at various conductivity or frequency values. As stated previously, the peak values of these losses are associated with conductivity or frequency values which coincide directly with those values producing the maximum degree of velocity variation.

Relating FIG. 2 to light conditions, the velocity decreases as conductivity increases and conductivity increases with light. Accordingly, the peak velocity value, point X, of curve A can be associated with the "dark" condition and the minimum velocity value, point Y, of curve A corresponds to the "light" condition. The intensity of light necessary to reach this condition varies with the photosensitivity of the material. All points on the curve A intermediate these extremes have associated therewith, an attenuation. Accordingly, it is seen that modulating the acoustic velocity, or the corresponding delay, through the use of intermediate light conditions, i.e., light intensity, necessarily produces attenuation losses in the acoustic signal. Consequently, this modulating technique, as previously outlined, is not altogether desirable.

This invention proposes to eliminate any significant attenuations associated with the velocity transition area by operating either at the maximum velocity value, ("dark" value), point X in FIG. 2 or the minimum velocity value ("light" value), point Y in FIG. 2. As is seen at these values, the accompanying attenuation losses are minimal. Such a modulating procedure is achieved by operating the delay line element partially illuminated. By that it is meant that part of the line is operated at a light value corresponding to point Y and the rest of the element is operated at a dark value corresponding to point X. No substantial part of the line is operated at an intermediate light value, that is, one accompanied by any substantial acoustic attenuation effects.

Figure 3:
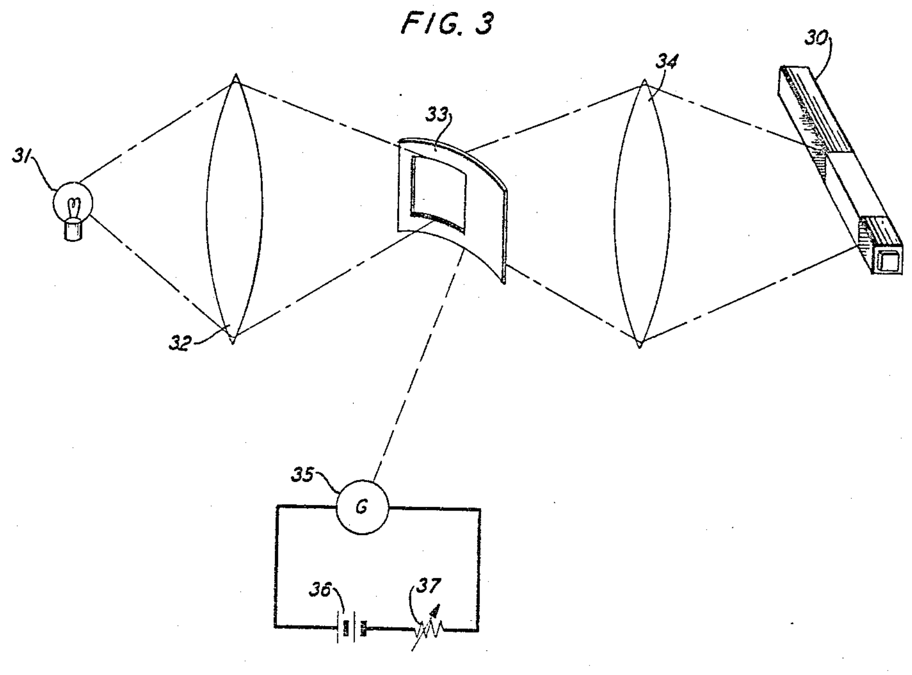
FIG. 3 is a schematic view of an ultrasonic delay line showing one particular modulating means operating according to the principles of this invention.

FIG. 3 shows one particular arrangement for modulating light onto the surface of the delay element. The delay line 30 is similar to that depicted in FIG. 1. Light source 31 is directed through convex lens 32 of a nature so as to provide a parallel beam and direct it through shutter 33. The light emanating from the shutter is directed through convex lens 34 which focuses on the delay element 30 which, as seen, is partially illuminated. The shutter 33 is operated by the arm of galvanometer 35, which in turn is energized by voltage source 36.

Potentiometer 37 is the ultimate control mechanism for varying the swing of the galvanometer and hence the portion of the delay element 30 illuminated. The potentiometer may conveniently be calibrated directly in percentage of the area of the delay element illuminated or, more directly, in terms of the delay time.

Figure 4:
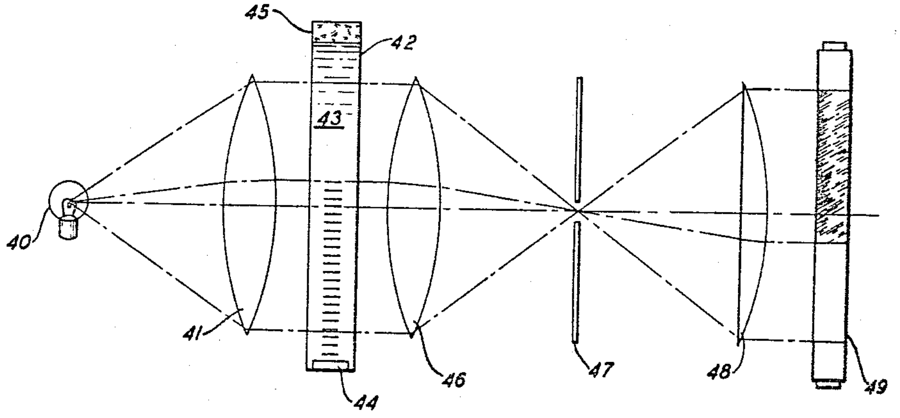
FIG. 4 is a schematic view of an additional modulating means employing an ultrasonic light valve.

FIG. 4 shows an additional means for varying the portion of the delay element illuminated. In this embodiment light source 40, is focused through converging lense 41 through an ultrasonic light valve or shutter indicated generally at 42. This device utilizes a transparent liquid medium 43 in which ultrasonic waves are induced by transducer 44. The extent of the ultrasonic waves across the medium, shown schematically at 43, determines the degree of the shutter or grating effect. Ultrasonic absorber 45 is disposed at the opposite end of the ultrasonic light valve. The light permitted through the valve 42 is focused by converging lense 46, through slit 47, another converging lense 48, onto the delay element 49. This device provides an accurate means with very short response for electronically modulating the light onto the delay element.

While any appropriate means may be employed for illuminating a portion of the delay element, it is important that the separation between the light and dark portions be distinct and that reflections tending to partially illuminate the otherwise dark areas are minimized. To this end, any medium or surfaces surrounding the delay line should be nonreflective or dull black. This is to eliminate the possibility of any substantial portion of the element being subjected to light having the intermediate intensities with which significant attenuation is associated.

The materials appropriate for use as the delay element are those which exhibit piezoelectric properties and which are additionally capable of exhibiting simultaneous photoconductive properties. Exemplary of such materials are cadmium sulfide and zinc oxide which are particularly adapted to this invention. These materials and their properties of interest are described in detail in United States Patents 3,090,876 and 3,093,758 issued May 21, 1963, and June 11, 1963, respectively. Additional materials will be apparent to those skilled in the art.

Whereas the terminology used herein refers to "light" and "dark" states, it should be appreciated that "light" requires light of an intensity sufficient to obtain substantially the maximum value of photoconductivity permitted by the photoconductive delay element while "dark" refers to a light state below that at which any substantial degree of photoconductivity occurs.

It will be obvious to those skilled in the art that the piezoelectric, photoconductive delay element must be properly oriented with respect to the direction of propagation of the acoustic signal through it in order to establish a piezoelectric field. Thus, the piezoelectric delay element in FIG. 1, for instance, must be oriented so that one of its piezoelectric axes lies substantially in a direction extending between the transducers. The appropriate crystallographic directions for materials adapted for this invention are well known in the art.

Whereas this invention has been described in its relation to ultrasonic delay lines, other uses which employ a control mechanism of light modulating the piezoelectric properties of materials according to the principles as set forth herein are considered to be within the scope of this invention.

What is claimed is:

1. A variable ultrasonic delay line which comprises a pair of piezoelectric transducers, a piezoelectric, photoconductive medium arranged between said pair of transducers so that an electric field applied across a first of said pair of transducers, resulting in a field in said sec- is transmitted through said medium into the second of said pair of transducers, resulting in a field in said sec ond transducer, said acoustic signal initiating a piezoelectric field in said medium, and means for varying the velocity of said acoustic signal through said medium which further comprises variable illuminating means associated with said element adapted to illuminate a varying portion of its surface, said illuminating means having a light intensity sufficient to provide substantially the maximum photoconductivity attainable in the portion of the photoconductive element so illuminated, and means for maintaining the remaining portion of said element at a light intensity below that at which any significant degree of photoconductivity occurs in said portion so that the degree of delay time provided by the line is represented by:

$$D = D_{dark} + (D_{light} - D_{dark}) \frac{E_1}{E_2}$$

where D is the delay time of the over-all line, $D_{dark}$ is the delay time for the line in the dark condition, $D_{light}$ is the delay time for the line in the light condition, $E_1$ is the length of the line illuminated, and $E_2$ is the total length of the line.

2. The device of claim 1 wherein the said medium is zinc oxide.

3. The device of claim 1 wherein the said medium is cadmium sulfide.

References Cited by the Examiner

UNITED STATES PATENTS

| | | | |
|---|---|---|---|
| 2,410,825 | 11/1946 | Lane | 310—9.5 |
| 2,584,324 | 2/1952 | Bousky | 252—62.9 |
| 2,596,460 | 5/1952 | Arenberg | 310—8.1 |
| 2,614,144 | 10/1952 | Howatt | 252—62.9 |
| 2,672,590 | 3/1954 | McSkimin | 333—72 |
| 2,691,738 | 10/1954 | Matthias | 252—62.9 |
| 2,793,288 | 5/1957 | Pulvari | 333—72 |
| 2,794,863 | 6/1957 | Van Roosbroeck | 332—3 |
| 2,870,338 | 1/1959 | Gillson | 307—88.55 |
| 2,917,669 | 12/1959 | Yando | 333—72 |
| 2,941,110 | 6/1960 | Yando | 333—72 |
| 2,945,984 | 7/1960 | Yando | 333—72 |
| 3,093,758 | 6/1963 | Hutson | 310—8.4 |

OTHER REFERENCES

Parmenter, "The Acousto-Electric Effect," Physical Review, vol. 89, No. 5, March 1, 1953, pp. 990–998.

HERMAN KARL SAALBACH, *Primary Examiner.*

MILTON M. FIELDS, *Examiner.*